US006934307B2

(12) United States Patent
DeCusatis et al.

(10) Patent No.: US 6,934,307 B2
(45) Date of Patent: Aug. 23, 2005

(54) MULTICHANNEL COMMUNICATIONS LINK RECEIVER HAVING PARALLEL OPTICAL COMPONENTS

(75) Inventors: Casimer M. DeCusatis, Poughkeepsie, NY (US); Lawrence Jacobowitz, Wappingers Fall, NY (US)

(73) Assignee: International Business Machines Corporation, Armonk, NY (US)

( * ) Notice: Subject to any disclaimer, the term of this patent is extended or adjusted under 35 U.S.C. 154(b) by 824 days.

(21) Appl. No.: 09/734,982

(22) Filed: Dec. 12, 2000

(65) Prior Publication Data

US 2005/0117517 A1    Jun. 2, 2005

(51) Int. Cl.⁷ .................................................. H04J 3/06

(52) U.S. Cl. .................... 370/518; 375/376; 398/202

(58) Field of Search ................................ 370/516, 518, 370/229, 235; 709/232; 398/131, 155, 202; 710/69, 71; 327/156; 375/373, 376, 327

(56) References Cited

U.S. PATENT DOCUMENTS

| | | | | |
|---|---|---|---|---|
| 5,157,530 A | * | 10/1992 | Loeb et al. | 359/124 |
| 5,349,653 A | * | 9/1994 | Kurokawa et al. | 35/500 |
| 5,522,088 A | | 5/1996 | Halma et al. | 395/881 |
| 5,581,566 A | | 12/1996 | St. John et al. | 371/37.6 |
| 5,651,033 A | | 7/1997 | Gregg et al. | 375/354 |
| 5,787,094 A | | 7/1998 | Cecchi et al. | 371/53 |
| 5,867,648 A | | 2/1999 | Foth et al. | 395/200.6 |
| 6,101,612 A | * | 8/2000 | Jeddeloh | 713/401 |
| 6,341,023 B1 | * | 1/2002 | Puc | 359/124 |
| 6,680,970 B1 | * | 1/2004 | Mejia | 375/225 |

* cited by examiner

*Primary Examiner*—Duc Ho
(74) *Attorney, Agent, or Firm*—Lily Neff, Esq.; Heslin Rothenberg Farley & Mesiti P.C.

(57) ABSTRACT

A receiver portion of a multichannel communications link uses optical components to receive data in parallel. Further, the receiver portion of the link provides various functions, including clock recovery, clock-to-data alignment and deskewing. The clock-to-data alignment provides for a dynamically adjusted clock that is used to regulate the output flow of data from the receiver portion, either in parallel or in series.

17 Claims, 6 Drawing Sheets

MULTICHANNEL COMMUNICATIONS LINK RECEIVER HAVING PARALLEL OPTICAL COMPONENTS

TECHNICAL FIELD

This invention relates, in general, to data communication and, in particular, to a receiver portion of a multichannel communications link having parallel optical components and providing functions, such as clock recovery, clock-to-data alignment, and deskewing.

BACKGROUND ART

Multichannel communications links are an important component of various computing platforms, including the S/390 and RS/6000 PowerParallel Systems offered by International Business Machines Corporation. One example of a multichannel communications link is the Self-Timed Interface (STI) data link offered by International Business Machines Corporation The Self-Timed Interface link is a 10 to 12 channel parallel data communications link that operates at speeds up to 500 Mbit/s per channel. The hardware of an STI link currently includes copper cables, which offer a maximum distance of about 50 meters.

Today, the data rates and distances offered by STI links are considered limiting in some circumstances. That is, there is an ever increasing desire to enhance the data rates on the multichannel links and to increase the distances supported by the links. However, the current copper link technology cannot support the higher data rates and/or the further distances.

Thus, a need exists for a multichannel communications link that can support higher data rates and longer distances. In particular, a need exists for an implementation of a receiver portion of a communications link that replaces the copper technology, but still offers similar functionality.

SUMMARY OF THE INVENTION

The shortcomings of the prior art are overcome and additional advantages are provided through the provision of a receiver portion of a communications link. The receiver portion includes, for instance, a plurality of optical fibers to receive a plurality of data units in parallel, wherein the plurality of data units have a relationship with one another; and an adjust unit to adjust a clock signal relative to a selected position of at least one data unit of the plurality of data units, wherein the clock signal is obtained from at least one data unit of the plurality of data units.

In a further aspect of the present invention, a method of determining a clock signal relative to data is provided. The method includes, for instance, receiving a plurality of data units in parallel over a plurality of optical fibers of a link, wherein the plurality of data units have a. relationship with one another; obtaining from at least one data unit of the plurality of data units a clock signal; and adjusting the clock signal relative to a selected position of at least one data unit of the plurality of data units.

Advantageously, the parallel optical implementation of the receiver portion of a multichannel communications link enables the support of higher data rates and longer distances. The parallel optical implementation integrates features such as clock recovery, deskewing, and clock-to-data alignment, which enables the parallel optical components to be a drop-in replacement for existing copper links.

Additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

BEST MODE FOR CARRYING OUT THE INVENTION

In accordance with an aspect of the present invention, a receiver portion of a multichannel communications link is provided in which optical components are used to receive data in parallel. Further, the receiver portion of the communications link provides various functions, including, for example, clock recovery, clock-to-data alignment and deskewing.

The communications link is usable in the computing area, including the large computing area in which processors are coupled to one another and to other facilities, as well as in other areas, such as in multimedia systems, pervasive computing applications, which plan to imbed microprocessors in many types of consumer products, and various other areas. In the example described herein, the communications link is used within a computing environment; however, this is only one example and is not meant to be limiting in any way.

Figure 1:
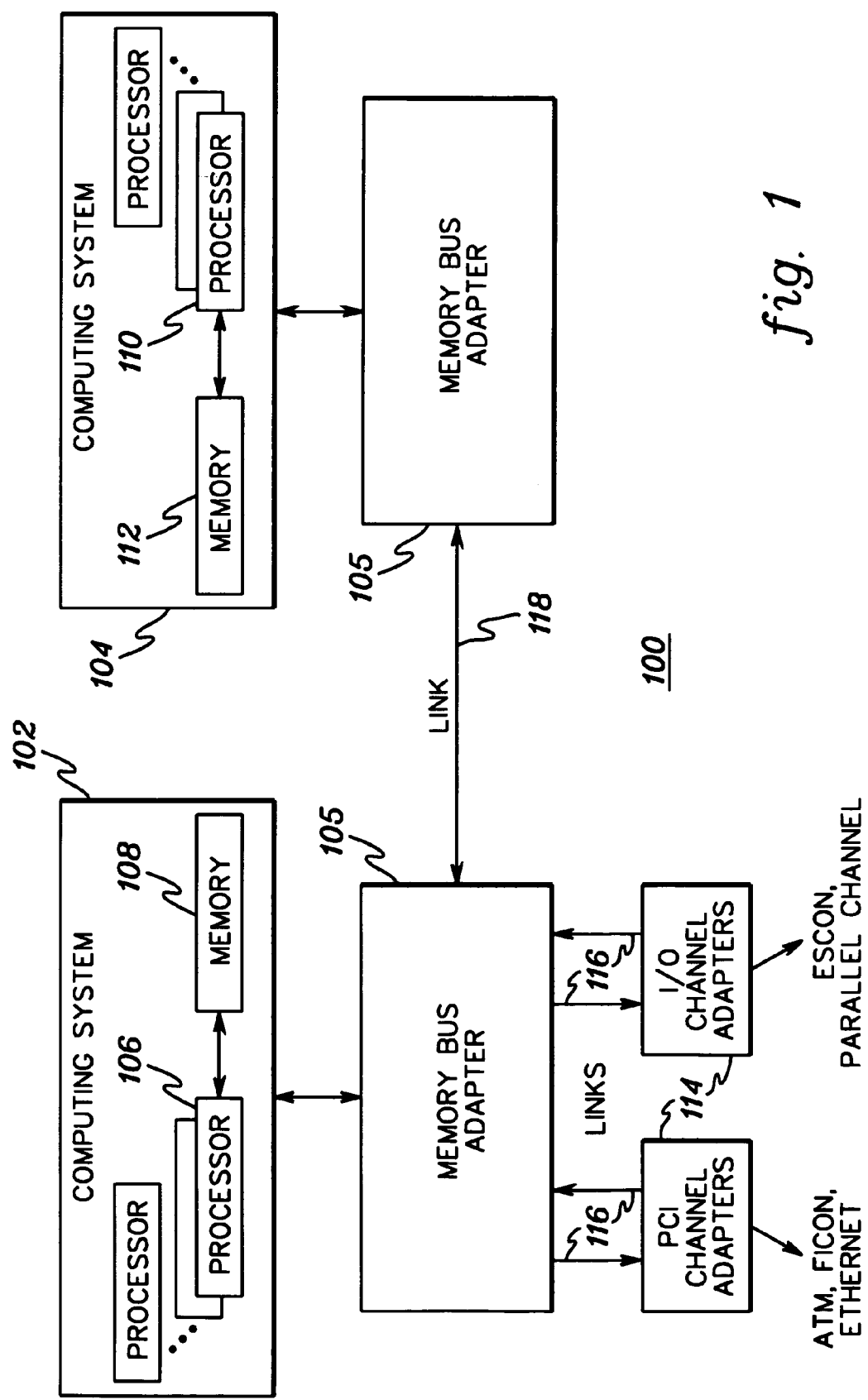
FIG. 1 depicts one example of a computing environment incorporating and using one or more aspects of the present invention.

One embodiment of a computing environment incorporating and using the capabilities of the present invention is depicted in FIG. 1 and described in detail herein. Computing environment 100 is based, for example, on the Enterprise Systems Architecture (ESA)/390 offered by International Business Machines Corporation. ESA/390 is described in an IBM Publication entitled *Enterprise Systems Architecture/390 Principles Of Operation*, IBM Publication No. SA22-7201-06, July 1999, which is hereby incorporated herein by reference in its entirety.

Computing environment 100 includes, for instance, one or more computing systems 102, 104 coupled to one or more memory bus adapters 105, each of which is described below.

In one example, computing system 102 includes one or more central processors 106 (i.e., central processing units) coupled to a main memory 108, which is accessed by the central processors. Each central processor may execute an operating system, such as the OS/390 Operating System offered by International Business Machines Corporation.

Computing System 104 also includes one or more central processors 110 coupled to a main memory 112. Again, each processor may execute an operating system.

In a further example, however, one or more of the computing systems (e.g., computing system 104) are coupling facilities, which are shareable facilities including one or more processors (e.g., processors 110) and a memory (e.g., memory 112). In this example, the memory is directly accessible by the processors of the coupling facility system, but is indirectly accessible by processors of other computing systems. Each of the processors of the coupling facility system executes coupling facility control code, instead of an operating system, to perform operations requested by the processors.

Aspects of the operation of a coupling facility are described in detail in such references as Elko et al., U.S. Pat. No. 5,317,739, entitled "Method And Apparatus For Coupling Data Processing Systems", issued May 31, 1994; Elko et al., U.S. Pat. No. 5,561,809, entitled "In A Multiprocessing System Having A Coupling Facility, Communicating Messages Between The Processors and Coupling Facility In Either A Synchronous Operation Or An Asynchronous Operation", issued Oct. 1, 1996; Elko et al., U.S. Pat. No. 5,706,432, entitled "Mechanism For Receiving Messages At A Coupling Facility", issued Jan. 6, 1998; and the patents and applications referred to therein, all of which are hereby incorporated herein by reference in their entirety.

Multiple computing systems may be interconnected. Further, each computing system (including the one or more coupling facility computing systems) may be logically partitioned, such that it can run multiple instances of the operating system and/or coupling facility control code.

Each computing system is coupled to a memory bus adapter 105. Memory bus adapter 105 provides assistance in fetching data from and storing data in memory. In one example, a memory bus adapter is used to couple the memory to various peripheral components, such as input/output devices. As examples, the input/output devices include disk drives, tape drives, local area network (LAN) attachments, and wide area network (WAN) attachments.

In order to couple the memory bus adapter to the I/O devices, the memory bus adapter is coupled to one or more channel adapters 114. Various types of channel adapters may be used. For example, one channel adapter provides a bridge to facilities such as the ATM, fiber connections (FICON), and the Ethernet. Other channel adapters are ESCON channel adapters or parallel channel adapters. These are only examples; other adapters may also be used.

In one example, the channel adapters are coupled to memory bus adapter 105 via multichannel links 116, such as the Self-Timed Interface links offered by IBM.

In addition to the above, memory bus adapters may be used to couple one system to another system. This coupling is also performed using a multichannel link 118, such as an STI link. In one example, the STI link used to couple the systems is adapted to be used as an Integrated Cluster Bus (i.e., as a channel), as described in U.S. Pat. No. 6,442,613, entitled "Controlling The flow Of Information Between Senders And Receivers Across Links Being Used As Channels", Gregg et al., issued Aug. 27, 2003, which is hereby incorporated herein by Reference in its entirety.

Additional details regarding STI links are described in such references as U.S. Pat. No. 5,757,297, entitled "Method and Apparatus for Recovering a Serial Data Stream Using a Local Clock", Ferraiolo et al., issued May 26, 1998; U.S. Pat. No. 5,859,881, entitled "Adaptive Filtering Method and Apparatus to Compensate For a Frequency Difference Between Two Clock Sources", Ferraiolo et al., issued Jan. 12, 1999; U.S. Pat. No. 5,522,088, entitled "Shared Channel subsystem Has A self Timed Interface Using A Received Clock Signal To Individually Phase Align Bits Received From A Parallel Bus", Halma et al., issued May 28, 1996; U.S. Pat. No. 5,631,033, entitled "Inter-System Data communication Channel Comprised Of Parallel Electrical Conductors That simulates The Performance Of A Bit Serial Optical Communications Link", Gregg et al., issued Jul. 22, 1997; and U.S. Pat. No. 5,787,094, entitled "Test And Diagnostics For A Self-Times Parallel Interface", Cecchi et al., issued Jul. 28, 1998, each of which is hereby incorporated herein by reference in its entirety.

The STI links described above include copper technology. In accordance with an aspect of the present invention, the copper technology of at least the receiver portion of the link is replaced by optical technology. For example, the copper conductors and electrical signal bus are replaced with optical fibers and an optical data bus. As described herein, the receiver portion of the multichannel link receives optical data in parallel, converts the optical data into digital data and outputs the digital data using a clock recovered from the input data. The clock is dynamically adjusted in real-time relative to a selected position of the input data and is used to regulate the output flow of data, either in series or in parallel.

One example of a receiver portion of a multichannel link is described with reference to FIG. 2. A receiver portion 200 includes a plurality of optical fibers 201, which provide parallel input data to an array of optical receivers 202. In one example, there are twelve optical fibers feeding twelve optical receivers. The number of optical fibers and receivers may differ from twelve, however.

A fiber carries an optical data unit from a transmitter portion of the link to an optical receiver. A data unit can be of various sizes including a bit, a byte, etc., and each data unit can include data, clock information and/or control information. Thus, the use of the term data unit herein includes a data unit having data and clock information and/or other control information, a data unit having data information, or a data unit having clock information. The plurality of data units have some relationship to one another (e.g., they are elements of a larger data structure, such as a data word).

The optical receivers are, for instance, photodiodes, which convert the input optical data to electrical data. The electrical data is output from the optical receivers and input to analog-to-digital (A/D) converters 204 coupled to the array of optical receivers. In one example, each optical receiver is coupled to an A/D converter, which converts the electrical data to digital signals. Conventional A/D converters may be used; however, to enhance performance, in one example, fast A/D converters, such as Silicon Germanium (SiGe) sigma-delta converters, are employed.

The output of the A/D converters (data out 205) is passed to other components of the computing environment. The flow of the output is regulated by a clock recovered from the input data and dynamically adjusted relative to the data, as described in detail herein.

In one example, the clock that is recovered from the input data can be on its own fiber or it can be a part of the data coming in on one or more of the fibers. In the embodiment described herein, the clock is input on its own fiber (e.g., the last fiber of the ribbons of fibers 201). However, this is only one example. Again, the clock can be input on any of the fibers and/or it may be part of the data.

Since, in this particular example, the data unit of the last optical receiver of the array is used to recover the clock, the data unit from that receiver is passed to an amplifier 206 to amplify the data. The amplified data is then passed to a phase lock loop (PLL) 208, which is used to recover the clock from the amplified data unit.

In one example, the phase lock loop is a digital phase lock loop, which locks onto a fundamental clock frequency. One example of a digital phase lock loop is described in U.S. Pat. No. 5,757,297, entitled "Method And Apparatus For Recovering A Serial Data Stream Using A Local Clock, Ferraiolo et al., issued May 26, 1998, which is hereby incorporated herein by reference in its entirety.

The output of the phase lock loop is provided to a comparator 210, which is employed to determine the proper clock-to-data alignment. That is, the comparator determines the difference or offset between an edge of the clock signal and an edge of a data unit. Thus, in addition to the output of the phase lock loop, another data unit of the optical receivers is input to the comparator, as shown in FIGS. 3a–3b.

Figure 3A:
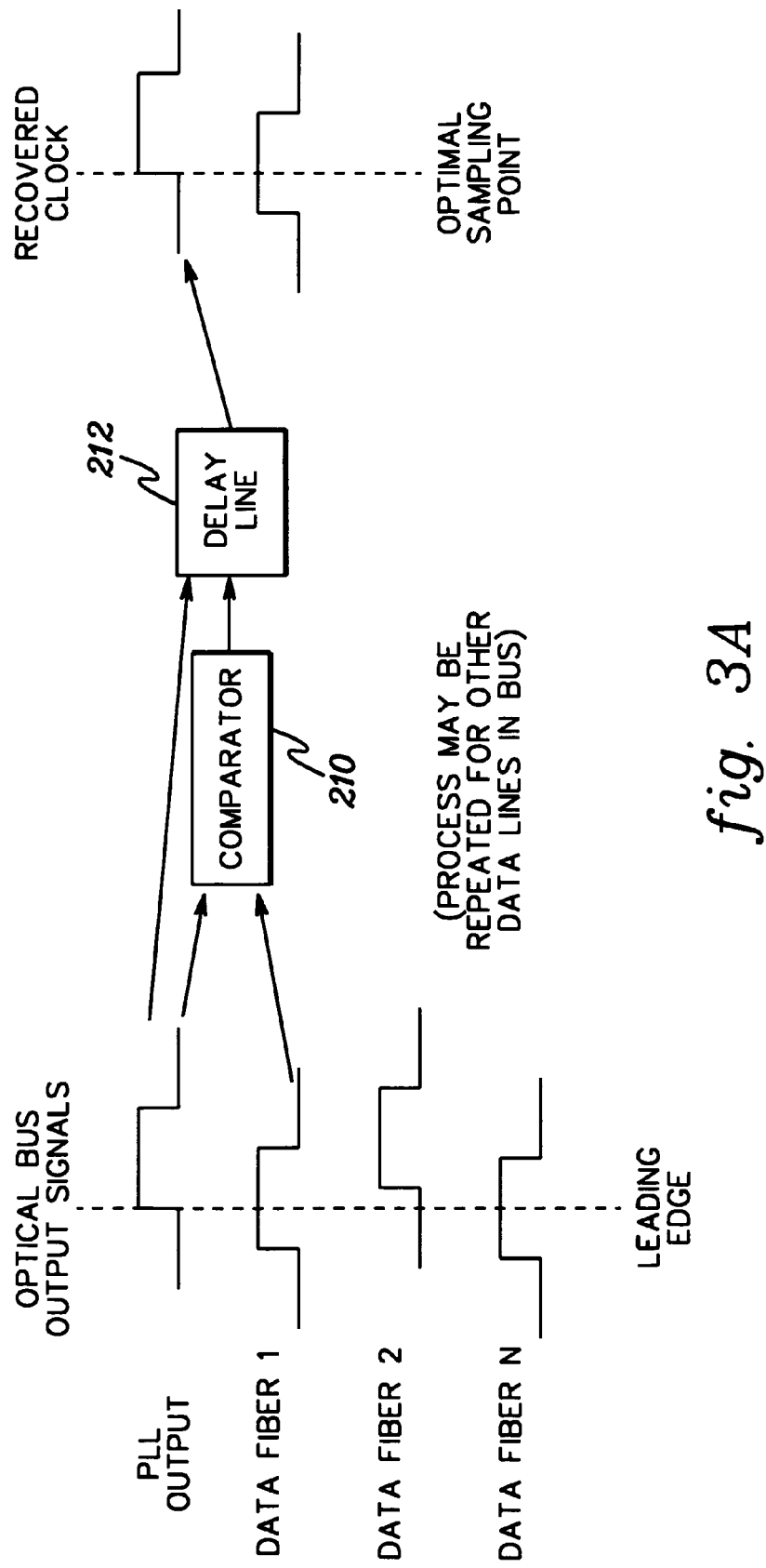
FIGS. 3a–3b depict examples of timing diagrams illustrating the alignment of clock-to-data, in accordance with an aspect of the present invention.
Figure 3B:
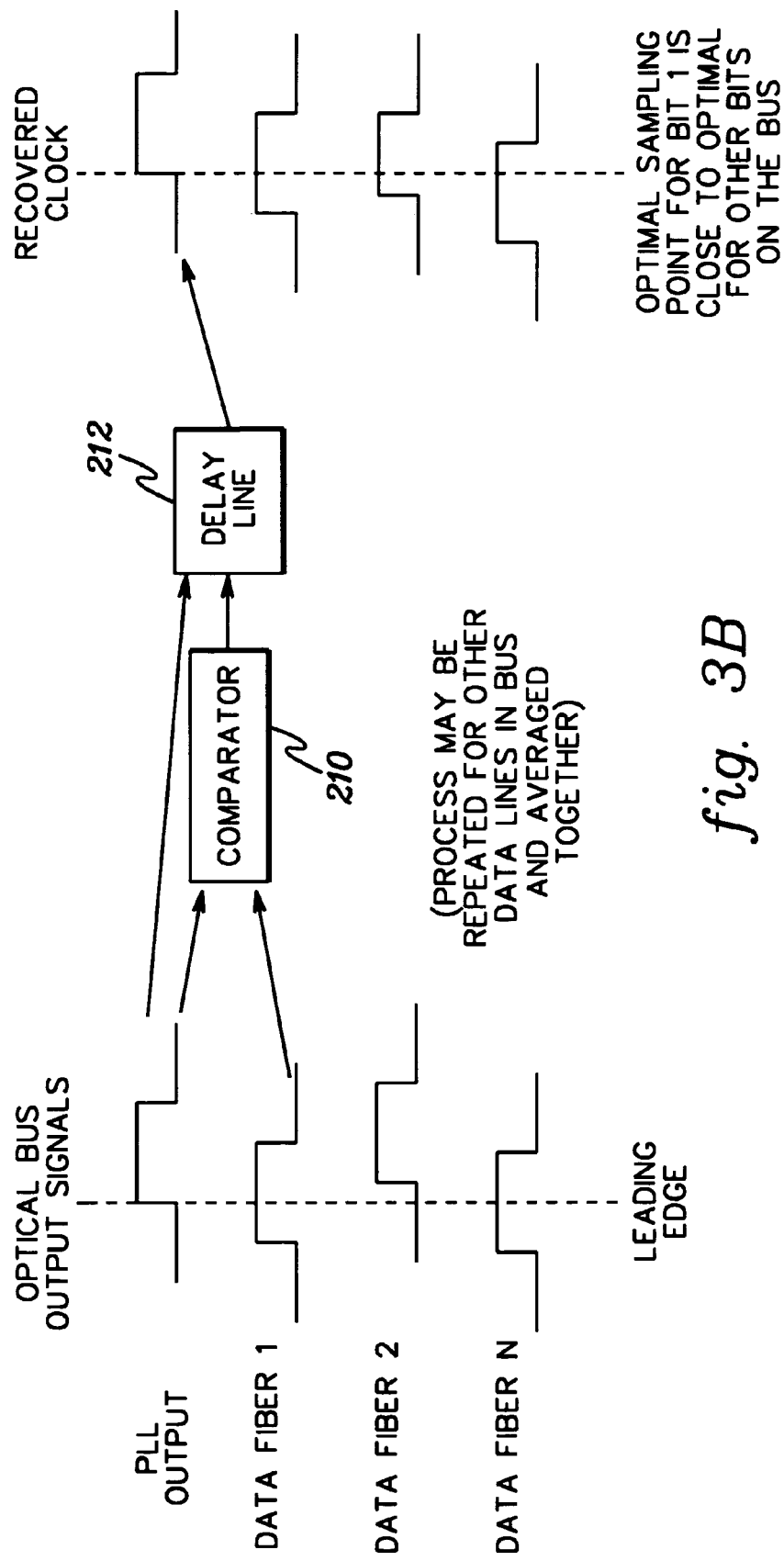

Since the arrival times of the data units to the optical receivers are skewed (as shown in FIGS. 3a–3b), a clock is recovered from one of the lines and then the edge of the clock is compared with the arrival time of another signal in the array. The comparator looks at the difference between the data edge and the clock edge and indicates whether they are misaligned and if so, by how much (i.e., the offset).

Figure 2:
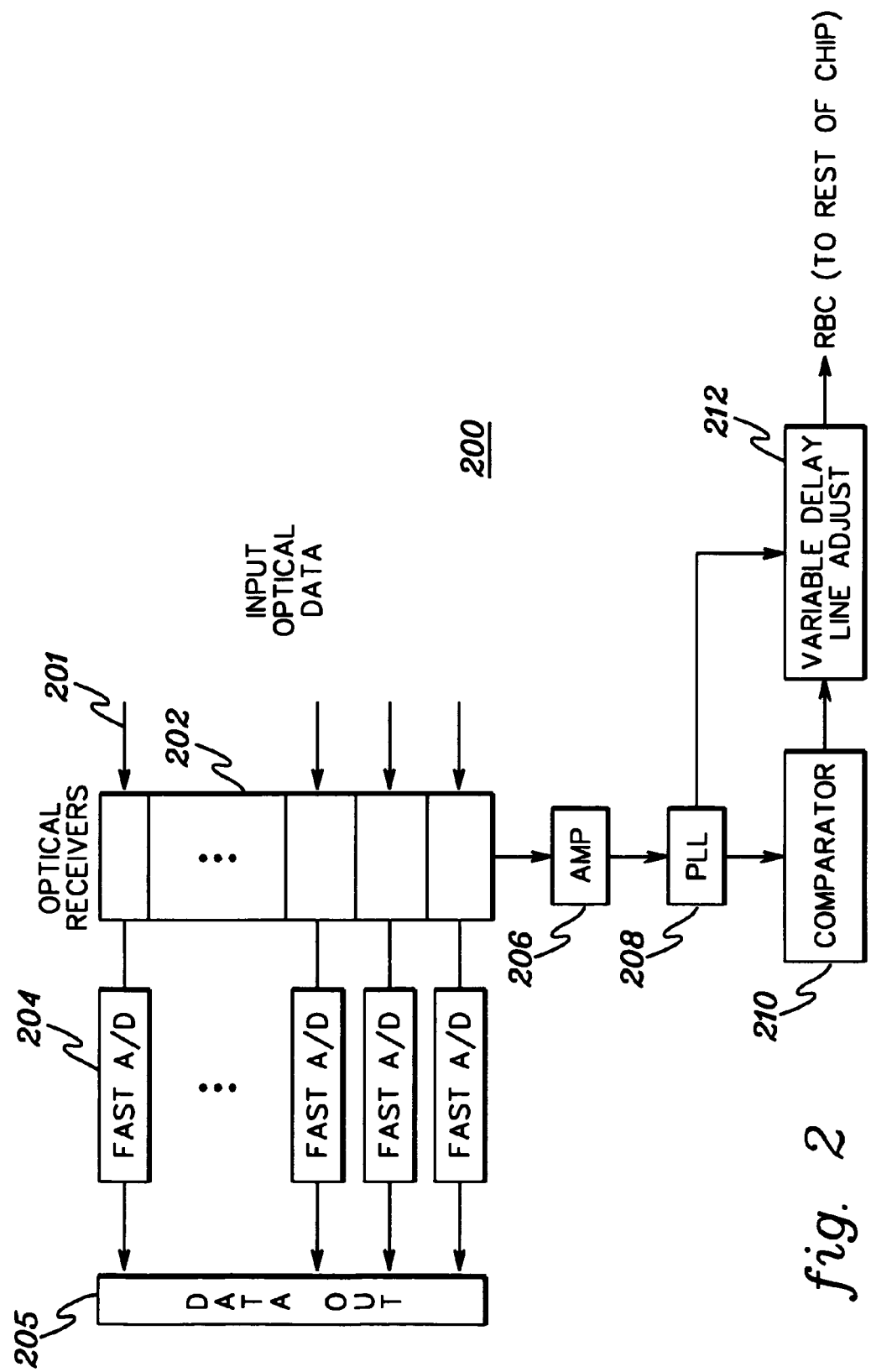
FIG. 2 depicts one implementation of a receiver portion of a multichannel communications link, in accordance with an aspect of the present invention.

The output of the comparator (i.e., the offset) is passed to a variable delay line adjust 212 (FIGS. 2 and 3a–3b). The variable delay line adjust also receives an output from the PLL. The variable delay line adjust is a digital or analog stepper that is designed to move the clock around in time, so that it is adjusted relative to a desired position (in time) of the data unit input to the comparator. In one example, the desired position is the middle of the data window. Thus, the delay line adjusts the clock relative to the data unit, such that the data unit is sampled at an optimal point (e.g., the middle of the data unit), as shown in FIG. 3a.

In accordance with an aspect of the present invention, the derived clock signal is optimized for all (or a portion) of the signals on the bus. As shown in FIG. 3b, the optimal sampling point for bit 1 is close to optimal for the other bits on the bus. This allows the recovered clock to be used as a reference for multiple data units.

In the above example, one data unit is input to the comparator and used to determine the clock offset. In other embodiments, however, more than one data unit may be used. For example, an average may be taken of offsets relating to a plurality of data units, and that average may be used as the offset. For example, assume one data unit indicates that the clock is offset by 0.5 seconds and a second data unit indicates that the clock is offset by 0.4 seconds. Those two offsets are averaged and the resulting offset is provided to the variable delay line adjust to be used in the adjustment.

Many other variations to determining the clock offset are also possible. For example, data units of specific receivers in the array may be used. For instance, if it is known that the first receiver and the last receiver tend to have more skew than the other receivers of the array, then the data units of those receivers are selected in determining the clock offset. Many other examples are also possible and are thus included within the scope of the present invention.

Once the clock is positioned correctly relative to the one or more data units, it is used as a receive byte clock to regulate the flow of output of the data units from the A/D converters. In one example, the data is clocked out in parallel.

The speed of the clock can be adjusted as often as desired (e.g., every few bit times). This enables different data rates to be used on the link (to within the tolerances of the digital phase lock loop) or to time division multiplex different data rates on the same link.

Figure 4:
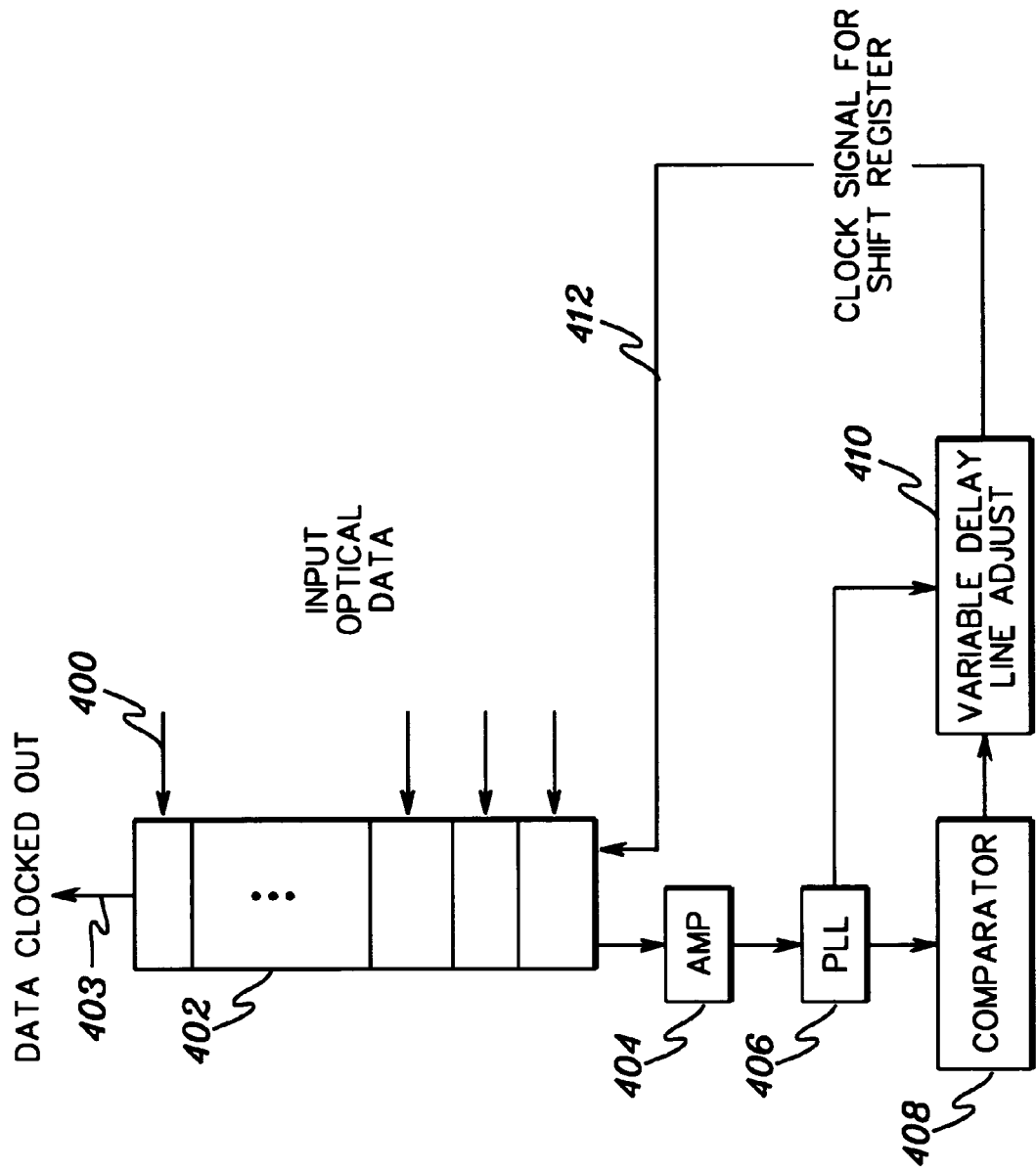
FIG. 4 depicts another implementation of a receiver portion of a multichannel communications link, in accordance with an aspect of the present invention.

Another embodiment of a receiver portion of a multichannel link having optical components is described with reference to FIG. 4. In this example, input optical data is received in parallel over a plurality of optical fibers 400, and fed into an array of shift register detectors 402 or a charge coupled device 402. Although, the data is received in parallel, it is clocked out serially 403. The flow of the data being output is regulated, in accordance with an aspect of the present invention, using a clock signal derived from the input data itself, as described below.

In one example, in order to recover the clock, a data unit having clock information is selected, and that data unit is input to an amplifier 404. The output of the amplifier is then input to a phase lock loop 406, which recovers the clock. The output of the phase lock loop and at least one other data unit is input to a comparator 408 to determine the clock offset. The output of the comparator, along with the output of PLL 406, is forwarded to a variable delay line adjust 410.

The result of the variable delay line adjust is an adjusted clock signal 412. As described above, the clock signal is adjusted such that it samples the data unit at an optimal point in time (e.g., in (or close to) the middle of the data unit). The adjusted clock signal is then input back to the shift register or charge coupled device using a feedback loop. In one example, the feedback loop is of SiGe, such that there is low jitter performance at high data rates.

Thus, as described above, data is sampled off of the shift register or charge coupled device, a clock is derived from the data, the clock is dynamically adjusted relative to the data, and the adjusted clock is used to extract the rest of the data from the shift register.

Figure 5:
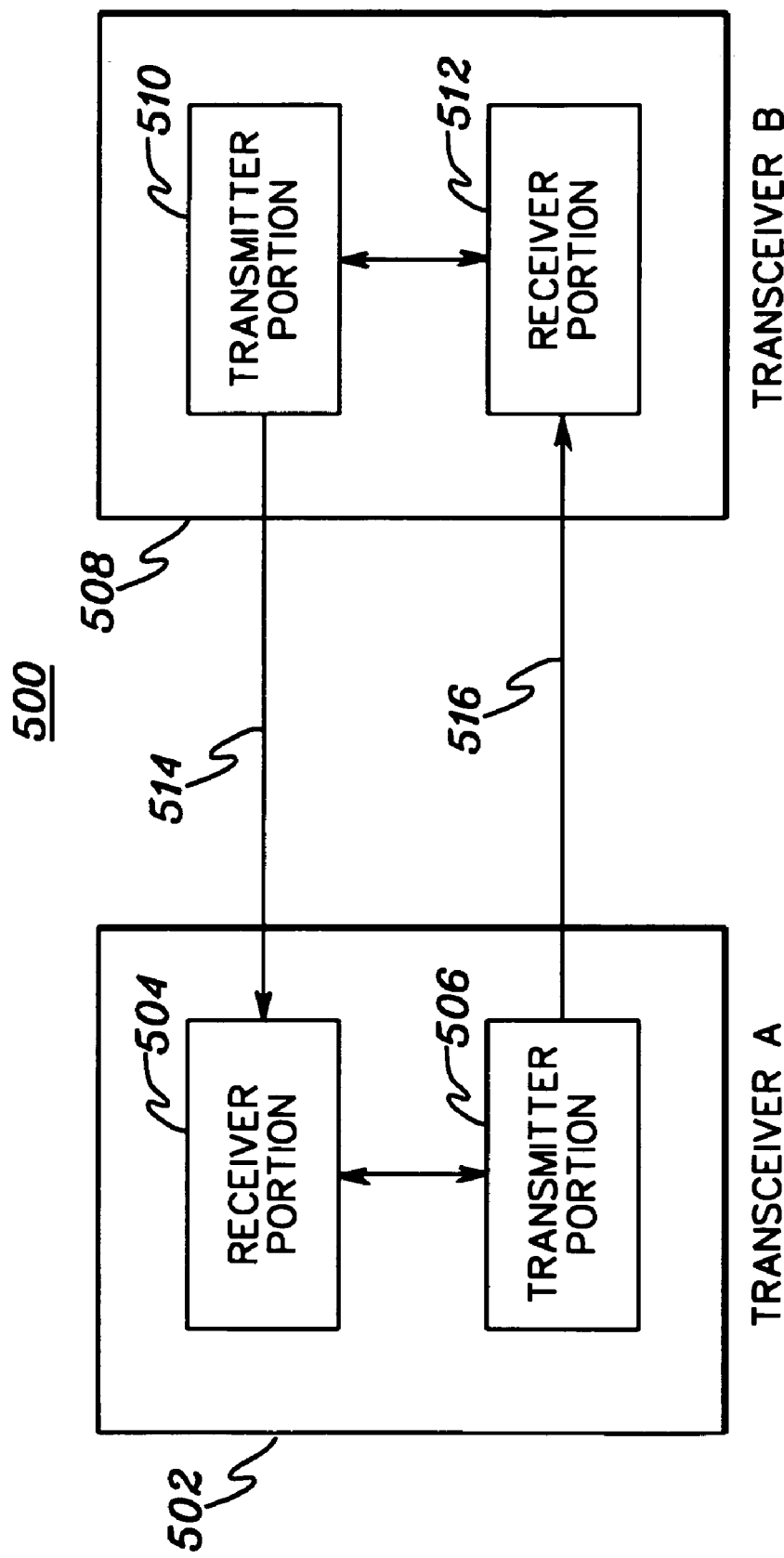
FIG. 5 depicts one embodiment of a multichannel communications link incorporating the receiver portion of the present invention.

Described in detail above are various embodiments of a receiver portion of a multichannel communications link. One embodiment of a multichannel link incorporating such a receiver portion is depicted in FIG. 5. A multichannel communications link 500 includes, for instance, a transceiver 502 (e.g., Transceiver A) having a receiver portion 504 coupled to a transmitter portion 506; and a transceiver 508 (e.g., Transceiver B) having a transmitter portion 510 coupled to a receiver portion 512.

Receiver portion 504 receives input data over optical fibers 514 from transmitter portion 510. Likewise, receiver portion 512 receives input data over optical fibers 516 from transmitter portion 506.

The receiver portion of the link may be manufactured of discrete components or of logic gates that are a part of an integrated circuit. The receiver portion can be sold as a separate chip or as part of a larger chip.

Advantageously, the parallel optical implementation of at least the receiver portion of the multichannel communications link supports higher data rates and longer distances. The parallel optical implementation integrates features such as clock recovery, deskewing, and clock-to-data alignment, which enables the parallel optical components to be a drop-in replacement for existing copper links.

Additionally, the integrated deskewing technology of the present invention allows the links to support variable data rates with common hardware, so that lower speed legacy links and higher speed future links can share common links by time division multiplexing. Integrated deskewing combined with parallel optical components minimizes the timing jitter on high speed links, offering better performance and improved bandwidth utilization compared with either copper or serial optical links. The timing jitter is at least minimized, since the data units are being sampled by a common clock.

Moreover, the dynamic adjustment of the clock-to-data relationship at least minimizes skew between the data units and the clock or between successive data units. This facilitates using optical components and fibers with lower mechanical tolerances and reduced implementation costs.

Although an embodiment of the present invention is described with reference to ESA/390, the invention is not limited to such an environment. The invention is also applicable for other computing environments, including, but not limited to, for instance, the AS/400, RS/6000, NUMA-Q, Netfinity, parallel HIPPI and Infiniband architectures.

Further, although an embodiment of the present invention is described with reference to a particular computing environment, the invention is applicable to areas outside of that environment. For example, aspects of the invention are applicable to multimedia systems which desire synchronized voice/video/data delivered with low jitter; pervasive computing applications which plan to embed microprocessors in many types of consumer products; as well as other areas.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A method of determining a clock signal relative to data, said method comprising:
receiving a plurality of data units in parallel over a plurality of optical fibers of a link, wherein said plurality of data units have a relationship with one another; and
obtaining from at least one data unit of said plurality of data units a clock signal;
adjusting the clock signal relative to a selected position of at least one data unit of said plurality of data units; and
using the adjusted clock signal to regulate a flow of output of one or more data units of the plurality of data units, wherein the one or more data units are output in parallel, and wherein the output is from one or more analog-to-digital converters coupled to one or more optical receivers receiving the one or more data units over one or more optical fibers of the plurality of optical fibers.

2. A method of determining a clock signal relative to data, said method comprising:
receiving a plurality of data units in parallel over a plurality of optical fibers of a link, wherein said plurality of data units have a relationship with one another; and wherein at least one data unit of the plurality of data units comprises data and clock information;
obtaining from at least one data unit of said plurality of data units a clock signal; and
adjusting the clock signal relative to a selected position of at least one data unit of said plurality of data units; wherein the selected position is a middle position of at least one data unit.

3. A receiver portion of a communications link comprising:
a plurality of optical fibers to receive a plurality of data units in parallel, wherein the plurality of data units have a relationship with one another, and wherein at least one data unit of the plurality of data units comprises data and clock information;
an adjust unit to adjust a clock signal relative to a selected position of at least one data unit of said plurality of data units, wherein said clock signal is obtained from the at least one data unit of the plurality of data units;
a plurality of optical receivers coupled to said plurality of optical fibers to receive said plurality of data units from said plurality of optical fibers; and
one or more analog-to-digital converters coupled to one or more optical receivers of said plurality of optical receivers to output one or more data units.

4. The receiver portion of claim 3, wherein the adjusted clock signal is used to regulate a flow of output from the one or more analog-to-digital converters.

5. A receiver portion of a communications link comprising:
a plurality of optical fibers to receive a plurality of data units in parallel, wherein the plurality of data units have a relationship with one another, and wherein at least one data unit of the plurality of data units comprises data and clock information;
an adjust unit to adjust a clock signal relative to a selected position of at least one data unit of said plurality of data units, wherein said clock signal is obtained from the at least one data unit of the plurality of data units;
a plurality of optical receivers coupled to said plurality of optical fibers to receive said plurality of data units from said plurality of optical fibers;
a phase lock loop coupled to at least one optical receiver of said plurality of optical receivers to recover from said at least one data unit the clock signal to be adjusted; and
a comparator coupled to said phase lock loop to determine an offset of an edge of the clock signal with respect to at least one edge of at least one data unit, wherein the offset is usable by the adjust unit.

6. The receiver portion of claim 5, wherein said comparator is adapted to determine a plurality of offsets with respect to a plurality of data units and to average the offsets to determine an average offset usable by the adjust unit.

7. A receiver portion of a communications link comprising:
a plurality of optical fibers to receive a plurality of data units in parallel, wherein the plurality of data units have a relationship with one another, and wherein at least one data unit of the plurality of data units comprises data and clock information;
an adjust unit to adjust a clock signal relative to a selected position of at least one data unit of said plurality of data units, wherein said clock signal is obtained from the at least one data unit of the plurality of data units; and wherein the selected position is a middle position of at least one data unit.

8. A receiver portion of a communications link comprising:
optical means for receiving a plurality of data units in parallel, wherein the plurality of data units have a relationship with one another, and wherein at least one data unit of the plurality of data units comprises data and clock information; and means for adjusting a clock signal relative to a selected position of at least one data unit of the plurality of data units, wherein the clock signal is obtained from the at least one data unit of the plurality of data units; and means for determining an offset of an edge of the clock signal with respect to at least one edge of at least one data unit, wherein the offset is usable by the means for adjusting.

9. A method of determining a clock signal relative to data, said method comprising:

receiving a plurality of data units in parallel over a plurality of optical fibers of a link, wherein said plurality of data units have a relationship with one another;

obtaining from at least one data unit of said plurality of data units a clock signal; and adjusting the clock signal relative to a selected position of at least one data unit of said plurality of data units; wherein the selected position is a middle position of at least one data unit.

10. A receiver portion of a communications link comprising:

a plurality of optical fibers to receive a plurality of data units in parallel, wherein the plurality of data units have a relationship with one another;

an adjust unit to adjust a clock signal relative to a selected position of at least one data unit of said plurality of data units, wherein said clock signal is obtained from the at least one data unit of the plurality of data units; and wherein said clock signal is a middle position of at least one data unit.

11. A method of determining a clock signal relative to data, said method comprising:

receiving a plurality of data units in parallel over a plurality of optical fibers of a link, wherein said plurality of data units have a relationship with one another;

obtaining from at least one data unit of said plurality of data units a clock signal;

adjusting the clock signal relative to a selected position of at least one data unit of said plurality of data units;

using the adjusted clock signal to regulate a flow of output of one or more data units of the plurality of data units, wherein the one or more data units are output in parallel, and wherein the output is from one or more analog-to-digital converters coupled to one or more optical receivers receiving the one or more data units over one or more optical fibers of the plurality of optical fibers.

12. A receiver portion of a communications link comprising:

a plurality of optical fibers to receive a plurality of data units in parallel, wherein the plurality of data units have a relationship with one another, and an adjust unit to adjust a clock signal relative to a selected position of at least one data unit of said plurality of data units, wherein said clock signal is obtained from the at least one data unit of the plurality of data units;

a plurality of optical receivers coupled to said plurality of optical fibers to receive said plurality of data units from said plurality of optical fibers; and one or more analog-to-digital converters coupled to one or more optical receivers of said plurality of optical receivers to output one or more data units.

13. The receiver portion of claim 12, wherein the adjusted clock signal is used to regulate a flow of output from the one or more analog-to-digital converters.

14. A receiver portion of a communications link comprising:

a plurality of optical fibers to receive a plurality of data units in parallel, wherein the plurality of data units have a relationship with one another;

an adjust unit to adjust a clock signal relative to a selected position of at least one data unit of said plurality of data units, wherein said clock signal is obtained from the at least one data unit of the plurality of data units;

a plurality of optical receivers coupled to said plurality of optical fibers to receive said plurality of data units from said plurality of optical fibers;

a phase lock loop coupled to at least one optical receiver of said plurality of optical receivers to recover from said at least one data unit the clock signal to be adjusted; and a comparator coupled to said phase lock loop to determine an offset of an edge of the clock signal with respect to at least one edge of at least one data unit, wherein the offset is usable by the adjust unit.

15. The receiver portion of claim 14, wherein said comparator is adapted to determine a plurality of offsets with respect to a plurality of data units and to average the offsets to determine an average offset usable by the adjust unit.

16. A receiver portion of a communications link comprising:

optical means for receiving a plurality of data units in parallel, wherein the plurality of data units have a relationship with one another, and means for adjusting a clock signal relative to a selected position of at least one data unit of the plurality of data units, wherein the clock signal is obtained from the at least one data unit of the plurality of data units; and means for determining an offset of an edge of the clock signal with respect to at least one edge of at least one data unit, wherein the offset is usable by the means for adjusting.

17. The receiver portion of claim 16, wherein the adjusted clock signal is used to regulate a flow of output of one or more of the data units.

* * * * *

UNITED STATES PATENT AND TRADEMARK OFFICE
CERTIFICATE OF CORRECTION

PATENT NO.     : 6,934,307 B2
DATED          : August 23, 2005
INVENTOR(S)    : DeCusatis et al.

It is certified that error appears in the above-identified patent and that said Letters Patent is hereby corrected as shown below:

Title page,
Item [75], Inventors, delete "Lawrence Jacobowitz, Wappingers Fall, NY (US)" and insert -- Lawrence Jacobwitz, Wappingers Falls, NY (US) --.

Column 3,
Line 58, delete the word "flow" and insert -- Flow --.

Column 4,
Line 3, delete the word "subsystem" and insert -- Subsystem --, and delete the word "self" and insert -- Self --.
Line 6, delete "5,631,033" and insert -- 5,651,033 --.
Lines 6 and 7, delete the word "communication" and insert -- Communication --.
Line 8, delete the word "simulates" and insert -- Simulates --.
Line 11, delete the word "Self-Times" and insert -- Self-Timed --.

Column 7,
Line 41, insert after the word "and", -- wherein at least one data unit of the plurality of data units comprises data and clock information; --.

Column 9,
Line 27, delete the word "the" after the word "from".
Line 29, delete the words "said clock signal" after the word "wherein".

Column 10,
Lines 19 and 43, delete the word "the" after the word "from".

Signed and Sealed this

Eleventh Day of October, 2005

JON W. DUDAS
*Director of the United States Patent and Trademark Office*